United States Patent
Bangerter et al.

(10) Patent No.: US 6,906,516 B2
(45) Date of Patent: Jun. 14, 2005

(54) ARTIFACT REDUCTION IN SSFP MRI USING WEIGHTED SUM OF COMBINED SIGNALS

(75) Inventors: Neal K. Bangerter, Stanford, CA (US); Dwight G. Nishimura, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/635,672

(22) Filed: Aug. 5, 2003

(65) Prior Publication Data

US 2005/0030023 A1 Feb. 10, 2005

(51) Int. Cl.[7] .................................................. G01V 3/00
(52) U.S. Cl. ........................................ 324/309; 324/307
(58) Field of Search ................................. 324/309, 307, 324/311, 313, 318, 319, 322, 300; 600/410

(56) References Cited

U.S. PATENT DOCUMENTS

| | | | | |
|---|---|---|---|---|
| 5,170,122 A | * | 12/1992 | Bernstein | 324/309 |
| 5,347,216 A | * | 9/1994 | Foo | 324/309 |
| 6,307,368 B1 | * | 10/2001 | Vasanawala et al. | 324/309 |
| 6,624,630 B1 | * | 9/2003 | Foxall | 324/307 |

OTHER PUBLICATIONS

Vasanawala et al., "Linear Combination Steady–State Free Precession MRI," Magnetic Resonance in Medicine 43: pp. 82–90, (2000).

Bangerter et al., "General Framework for the SNR Analysis of Multiple–Acquisition SSFP," Proceedings of 11th Annual ISMRM, Jul. 10–16, 2003, p. 976.

* cited by examiner

*Primary Examiner*—Brij B. Shrivastav
(74) *Attorney, Agent, or Firm*—Beyer Weaver & Thomas LLP

(57) ABSTRACT

Artifact reduction in steady state free precession magnetic resonance imaging uses weighting of acquired image data to emphasize higher signals and then establishing an image signal based on the combined weighted signals. In one embodiment, a SSFP imaging sequence uses phase cycling and acquired image data is squared with the squared data then combined. The final image signal is based on the square root of the squared data.

13 Claims, 2 Drawing Sheets

ARTIFACT REDUCTION IN SSFP MRI USING WEIGHTED SUM OF COMBINED SIGNALS

GOVERNMENT RIGHTS

The U.S. government has rights in the disclosed invention pursuant to NIH grants to Stanford University including NIH-HL39297, T32 HL07846, and AR46904.

BACKGROUND OF THE INVENTION

This invention relates generally to magnetic resonance imaging (MRI), and more particularly the invention relates to MRI using steady state free precession (SSFP) with image artifact reduction.

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During a MR experiment, each nuclear spin responds to four different effects—precession about the main magnetic field, nutation about an axis perpendicular to the main field, and both transverse and longitudinal relaxation. In steady-state MR experiments, a combination of these effects occurs periodically.

Refocused steady-state free precession (SSFP) sequences have recently gained popularity in magnetic resonance imaging, due to improved gradient hardware. SSFP imaging provides high signal and good contrast in short scan times. However, in regions of high local magnetic field variations, SSFP images often suffer from characteristic bands of signal loss, or "banding artifact".

The banding artifact becomes more pronounced as the main magnetic field strength B0 and any inhomogeniety therein is increased, due to the increased off-resonance precession per sequence repetition time TR. Likewise, as the sequence repetition time TR is increased, any off-resonance banding artifact will become more pronounced due to the increased off-resonance precession per TR. There is currently considerable interest in using SSFP sequences at both higher main field strengths and for higher resolution images, which usually require longer TRs. However, both of these changes will increase the severity of the banding artifact. A method for reducing or eliminating off-resonance banding at higher field strengths or longer TRs would clearly be useful.

Several methods have been proposed for reducing the banding artifact in SSFP imaging by combining multiple phase-cycled image acquisitions in various ways. These include a maximum-intensity combination method and a simple complex-sum combination method. The effectiveness at removing banding artifacts varies with number of acquisitions combined, tissue parameters T1 and T2, and tip angle. As multiple acquisitions of the same image must be performed, the SNR efficiency of each of these techniques suffers when compared with the SNR efficiency of a single SSFP image acquisition.

SUMMARY OF THE INVENTION

In accordance with the invention, artifacts in SSFP images are reduced by acquiring image data for a plurality of imaging sequences and then weighting the acquired image data to emphasize higher signals. The weighted data is then combined and used to establish an image signal.

In one embodiment, the SSFP imaging sequence is phase cycled, the acquired image data is squared and the squared data is then combined. The image signal is based on the square root of the squared data.

In other embodiments, a general weighted combination of the acquired data from the SSFP imaging sequences can be used. One example is weighting the image data based on a computed off-resonance profile using a magnetic field map for the imaged object.

In phase cycling the SSFP imaging sequences, N phase-cycled individual SSFP sequences can be performed with the $n^{th}$ acquisition incrementing the phase from excitation to excitation by $$\Delta\phi = 2\pi n/N.$$

The invention and objects and features thereof will be more readily apparent from the following detailed description and appended claims when taken with the drawings.

DETAILED DESCRIPTION OF ILLUSTRATED EMBODIMENTS

Figure 1A:
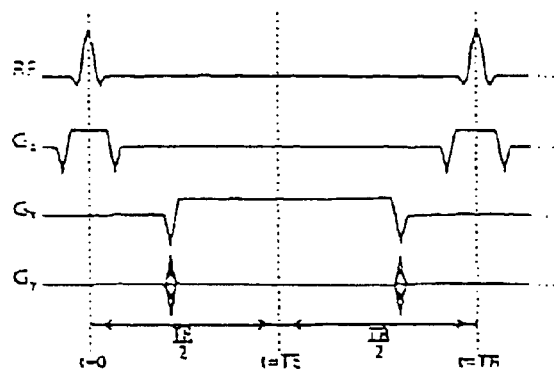
FIGS. 1A, 1B illustrate a SSFP phase sequence in accordance with prior art.
Figure 1B:
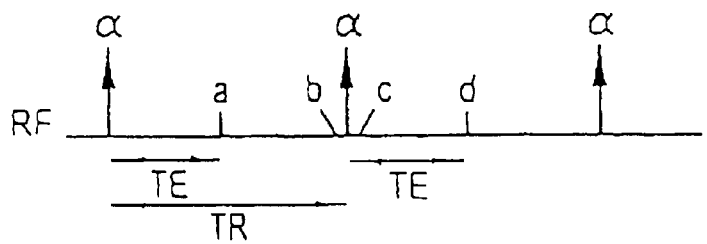

As illustrated in FIGS. 1A, 1B, a refocused SSFP sequence includes a single RF excitation which is repeated periodically. All gradients used for slice selection or imaging are fully rewound over each repetitive time, TR. In the steady-state, the magnetization at points a and d is the same.

Magnetization is tipped about a traverse axis through an angle $\alpha$. Between excitations, the magnetization undergoes a precession by an angle $\theta = 2\pi\Delta fTR$ about the z-axis (direction of B0), where $\Delta f$ is the tissue off-resonance, and also experiences both T1 and T2 relaxation.

During the sequence each spin is affected by RF pulses, relaxation and free precession. The steady-state magnetization for SSFP is a function of the sequence parameters flip angle ($\alpha$), repetition time (TR) and echo time (TE) as well as the tissue parameters T1, T2, and resonant frequency shift $\Delta f$.

Figure 2:
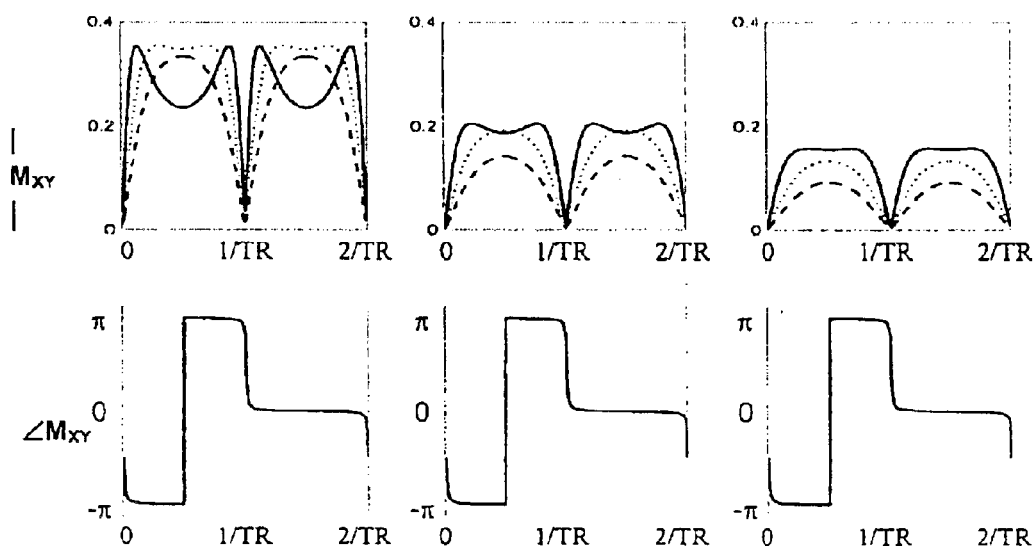
FIG. 2 illustrates SSFP transverse magnetization and phase as a function of off-resonance frequency for a SSFP signal profile.

Signal readout is performed each period, with low spatial frequency information acquired at an echo time TE typically spaced midway between the RF excitation pulses. The resultant steady-state MR signal is a strong function of the local resonant frequency, as shown in FIG. 2, which shows magnetization or signal profiles (i.e., off-resonance spectra).

SSFP transverse magnetization magnitude (top) and phase (bottom) are shown as a function of off-resonant frequency. Each graph shows three different tip angles: the solid line corresponds to a 30° tip angle, the dotted line 60°, and the dashed line 90°. Profiles are shown for three different T1/T2 combinations: T1/T2=200/100 ms (left), T1/T2=600/100 ms (middle), and T1/T2=1000/100 ms (right). TE=TR/2 in all cases. The periodic nulls in the signal profile, separated by a frequency of 1/TR, are the source of off-resonance banding artifacts.

If the phase φ of the RF excitation pulse is incremented by a constant value Δφ from excitation to excitation ("phase cycling"), the magnetization profile is shifted in off-resonance frequency by Δφ/(2π·TR). Both the maximum-intensity and complex-sum combination methods make use of N individual image acquisitions, each acquisition employing Δφ=2πn/N, where n=1, . . . , N. The resultant shift in magnetization profile is exploited in each case to eliminate the signal nulls in the reconstructed image. A maximum-intensity image is formed by choosing the brightest pixel at each point from the corresponding pixel in each of the N phase-cycled acquisitions. See Haacke et al., Radiology 1990; 175: 545–552. A complex-sum technique consists in simply summing the complex reconstructed images from each acquisition. See Vasanawala et al., Magn. Reson. Med. 2000; 43: 82–90.

The present invention employs identical data acquisition as in the prior art where N phase-cycled individual SSFP image acquisitions are performed, $n^{th}$ acquisition incrementing the phase from excitation to excitation by Δφ=2πn/N. Let $M_n$ represent the $n^{th}$ complex reconstructed image. The final reconstructed image is formed by weighting the image data such as by taking the square root of the sum of the magnitudes of each $M_n$ squared. That is, the final reconstructed image $M_{final}$ is given by:

$$M_{final} = \sqrt{|M_1|^2 + \ldots + |M_N|^2}.$$

The invention can be performed on both 2D and 3D SSFP data sets.

Simulations have shown the root sum-of-squares method to yield significantly higher average SNR (often more than 25% higher) than both maximum-intensity and complex-sum combination SSFP. Furthermore, the method compares favorably with the other methods in terms of banding artifact reduction. While maximum-intensity and complex-sum combination in theory yield slightly flatter magnetization profiles, the difference is hardly perceptible in practice, and is more than compensated for by the significant increase in SNR.

Figure 3:
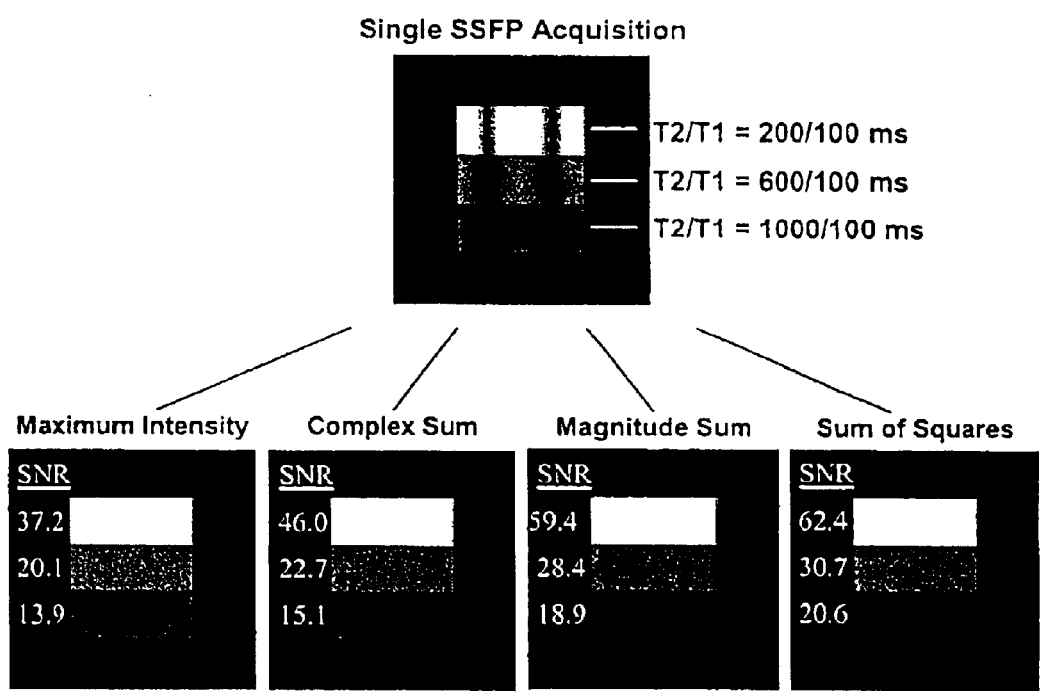
FIG. 3 illustrates images of a phantom simulation using prior art and using sum of the squares signal combination in accordance with one embodiment of the invention.

FIG. 3 shows a phantom simulation comparing the different combination methods. The top image is a simulated phantom with three different T2/T1 species exhibiting off-resonance banding artifact. The bottom images show the results when 4 phase-cycled acquisitions are combined with each method (N=4). The images were simulated using TR/TE=10/5 ms and α=60°. The complex sum image has better SNR than the maximum intensity image, while the sum-of-squares image has SNR approximately 35% higher than the complex sum image. These images also allow the visualization of the residual banding artifact using each method.

The SNR advantage of the invention can intuitively be understood by examining the magnetization profiles shown in FIG. 2. The transverse magnetization, or signal, at different resonant frequencies is indicated on the graph. The noise associated with any measurement of this signal is assumed to be independent of local resonant frequency, while the signal itself varies significantly. By squaring the magnitude of each pixel in the individual acquisitions, one is essentially giving more weight to individual pixel acquisitions with higher signal, and hence higher SNR, and less to those individual pixel acquisitions with lower SNR. The N individual phase-cycled acquisitions for a given pixel should be spread evenly across one period of the magnetization profile, so that a range of individual pixel acquisition SNRs based on their position along the profile is provided. Applying a weighting to each acquisition based on its observed signal allows a boost to overall average SNR. The square root operation is then performed after the sum-of-squares to eliminate the quadratic effect on contrast.

Figures 4A, 4B:
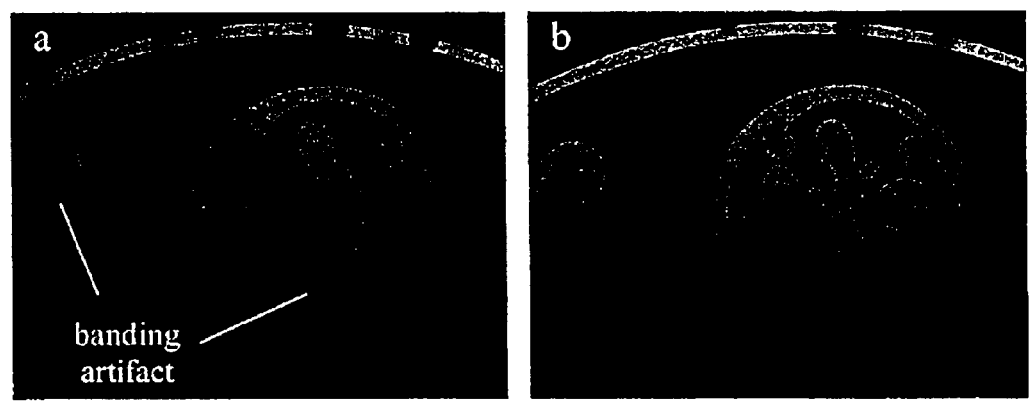
FIGS. 4A, 4B illustrate banding artifacts in a high resolution SSFP image in accordance with prior art and a reduction in banding artifacts using weighted image data in accordance with an embodiment of the invention.

FIG. 4A shows a high-resolution single SSFP acquisition (156 μm in-plane resolution, 1 mm slice thickness, 60° tip, TR=18 ms) exhibiting quite severe banding artifact. The relatively long TR needed to achieve this resolution causes the banding artifact to be quite severe. FIG. 4B shows a sum-of-squares combination of four phase-cycled SSFP acquisitions, effectively eliminating the banding artifact. Both images employ TR=18 ms with a 60° tip angle. Resolution is 156 μm in plane with a 1 mm slice thickness.

The root sum-of-squares method is one specific example of a general weighted combination SSFP approach, in which individual pixel samples are weighted prior to combination based on the expected SNR of each sample. While the root sum-of-squares method may be optimal if no information is available a priori about the local resonant frequencies across the field of interest of the body to be imaged, other weighting schemes could be more effective. If, for example, a field map of the object is acquired, a weighting matching the computed off-resonance profile for a dominant tissue in the body could be applied, conceivably improving SNR. In general, any information about the variations in local frequency may theoretically be incorporated in the weighting scheme to maximize average SNR. Variations somewhere between root sum-of-squares and maximum-intensity can be employed, where the M observations of highest signal are weighted and combined, and the remaining N–M observations are deemphasized.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

Attached hereto and incorporated by reference for all purposes are an abstract published in Proceedings of $11^{th}$ Annual ISMRM, 10–16 Jul. 2003, p. 976, and entitled "General Framework for the SNR Analysis of Multiple Acquisition SSFP" by N. K. Bangerter, B. A. Hargreaves, D. G. Nishimura and a paper submitted to the Magnetic Resonance in Medicine entitled "Analysis of Multiple Acquisition SSFP," by N. K. Bangerter, B. A. Hargreaves, S. S. Vasanawala, J. M. Pauly and D. G. Nishimura.

What is claimed is:

1. A method of reducing artifacts in steady state free precession (SSFP) signals for use in magnetic resonance imaging comprising the steps of:

a) applying a plurality of SSFP imaging sequences to an object to be imaged, b) acquiring image data for each of the SSFP imaging sequences, c) weighting the image data to emphasize higher magnitude signals, d) combining the weighted image data from all imaging sequences, and e) establishing an image signal based on the combined weighted image data.

2. The method as defined by claim 1 wherein the plurality of SSFP imaging sequences are phase-cycled.

3. A method of reducing artifacts in steady state free precession (SSFP) signals for use in magnetic resonance imaging comprising the steps of:

a) applying a plurality phase-cycled of SSFP imaging sequences to an object to be imaged, b) acquiring image data for each of the SSFP imaging sequences, c) weighting by squaring the image data for each sequence to emphasize higher signals, d) combining by summing the weighted image data, and e) establishing an image signal based on the combined weighted image data.

4. The method as defined by claim 3 wherein step e) establishes an image signal from the square root of the sum of the squares of the image data.

5. A method of reducing artifacts in steady state free precession (SSFP) signals for use in magnetic resonance imaging comprising the steps of:

a) applying a plurality of phase-cycled of SSFP imaging sequences to an object to be imaged, b) acquiring image data for each of the SSFP imaging sequences, c) weighting the image data to emphasize higher signals based on a computed off-resonance profile using a magnetic field map for the imaged object, d) combining the weighted image data, and e) establishing an image signal based on the combined weighted image data.

6. A method of reducing artifacts in steady state free precession (SSFP) signals for use in magnetic resonance imaging comprising the steps of:

a) applying a plurality phase-cycled of SSFP imaging sequences to an object to be imaged, b) acquiring image data for each of the SSFP imaging sequences wherein N phase-cycled individual SSFP image acquisitions are performed with the $n^{th}$ acquisition incrementing the phase from excitation to excitation by $$\Delta\phi=2\pi n/N_2$$

c) weighting the image data to emphasize higher signals, d) combining the weighted image data, and e) establishing an image signal based on the combined weighted image data.

7. The method as defined by claim 6 wherein step c) squares the image data for each sequence, and step d) sums the squares of the image data.

8. The method as defined claim 7 wherein step e) establishes an image signal from the square root of the sum of the squares of the image data.

9. The method as defined by claim 8 wherein the SSFP image data is two-dimensional.

10. The method as defined by claim 8 wherein the SSFP image data is three-dimensional.

11. A method of reducing artifacts in steady state free precession (SSFP) signals for use in magnetic resonance imaging comprising the steps of:

a) applying a plurality of SSFP imaging sequences to an object to be imaged, wherein each SSFP imaging sequence includes:

i) placing a body in a magnetic field, ii) applying gradient magnetic fields to the body, iii) applying a plurality of RE excitation pulses to the body at repetition time, TR, to flip nuclei spins, with RF phase incremental from TR to TR by a phase increment, $\Delta\phi$ iv) rewinding all gradients over each repetition time, TR, v) measuring refocused MRI signals at echo times, TE during each sequence, and vi) repeating steps ii–v) for subsequent sequences with the RE excitation pulses in each sequence being incremented in phase by a different $\Delta\phi$, b) acquiring image data for each of the SSFP imaging sequences, c) weighting the image data to emphasize higher signals, d) combining the weighted image data, and e) establishing an image signal based on the combined weighted image data.

12. The method as defined by claim 11 wherein the SSFP image data is three-dimensional.

13. The method as defined by claim 11 wherein the SSFP image data is two-dimensional.

* * * * *